US009036734B1

(12) United States Patent
Mauer et al.

(10) Patent No.: US 9,036,734 B1
(45) Date of Patent: May 19, 2015

(54) METHODS AND APPARATUS FOR PERFORMING DIGITAL PREDISTORTION USING TIME DOMAIN AND FREQUENCY DOMAIN ALIGNMENT

(71) Applicant: Altera Corporation, San Jose, CA (US)

(72) Inventors: Volker Mauer, Princes Risborough (GB); Shahin Gheitanchi, Maidenhead (GB); Benjamin Thomas Cop, London (GB)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/947,620

(22) Filed: Jul. 22, 2013

(51) Int. Cl.
H04L 25/49 (2006.01)
H04B 1/04 (2006.01)

(52) U.S. Cl.
CPC .................... H04B 1/0475 (2013.01)

(58) Field of Classification Search
USPC ............. 375/295, 296, 297; 455/114.2, 114.3
See application file for complete search history.

(56) References Cited

U.S. PATENT DOCUMENTS

| 7,269,231 | B2* | 9/2007 | Ding et al. ..................... 375/296 |
| 7,479,828 | B2* | 1/2009 | Benedict ....................... 330/149 |
| 8,145,477 | B2* | 3/2012 | Manjunath et al. ........... 704/207 |
| 8,737,523 | B2* | 5/2014 | Barnes ........................... 375/296 |
| 2006/0240786 | A1* | 10/2006 | Liu ............................. 455/114.3 |
| 2009/0201202 | A1* | 8/2009 | Young ....................... 342/357.12 |
| 2010/0054364 | A1* | 3/2010 | Cai et al. ......................... 375/296 |
| 2012/0019320 | A1* | 1/2012 | Cummins ....................... 330/149 |
| 2012/0032739 | A1* | 2/2012 | Peroulas et al. ............... 330/149 |
| 2012/0106600 | A1* | 5/2012 | Yu et al. .......................... 375/219 |

OTHER PUBLICATIONS

M. Weiβ, "Measuring the Dynamic Characteristic of High-Frequency Amplifiers with Real Signals", Proceedings of European wireless 2000, pp. 67.
Boumaiza et al., "Systematic and Adaptive Characterization Approach for Behavior Modeling and Correction of Dynamic Nonlinear Transmitters", IEEE Transactions on Instrumentation and Measurement, vol. 56, No. 6, Dec. 2007, pp. 2203-2211.
Mauer et al., U.S. Appl. No. 13/625,782, filed Sep. 24, 2012.

* cited by examiner

Primary Examiner — Siu Lee
(74) Attorney, Agent, or Firm — Treyz Law Group; Jason Tsai; Michael H. Lyons

(57) ABSTRACT

Integrated circuits with wireless communications circuitry having digital predistortion (DPD) circuitry are provided. The digital predistortion circuitry may include a forward path filter, a time domain alignment (TDA) circuit, a frequency domain alignment (FDA) circuit, and an adaption circuit. The TDA circuit may receive power amplifier input signals and power amplifier output signals and may include a cross correlator, a peak detector, and a delay circuit for performing coarse time domain alignment (i.e., to align the power amplifier input and output signals). The FDA circuit may include a fast Fourier transform circuit, a matrix multiplier, and a matrix inverter for performing frequency domain alignment. The adaption circuit may analyze the aligned signals output from the FDA circuit to produce impulse response coefficients that are then used to control the forward path filter. The forward path filter may serve to predistort transmit signals prior to radio-frequency amplification.

16 Claims, 10 Drawing Sheets

|                        | MEM(B) | DSP | LATENCY  |
|------------------------|--------|-----|----------|
| TDA (COURSE & FINE)    | 2M     | 15  | 15       |
| FDA (32K FFT)          | 64K    | 55  | 130000+  |
| COURSE TDA + FDA (8K FFT) | 64K | 54  | ~33000   |

FIG. 10

| | σ OF (Tx-ORx) AFTER ALIGNMENT | | |
|---|---|---|---|
| | S=61.44 | S/2=30.72 | S/3=20.48 |
| TDA (Coarse) | 0.0619 | 0.1402 | 0.1391 |
| TDA (Coarse and Fine) | 0.0594 | 0.1481 | 0.2195 |
| FDA (32k) | 0.1594 | 0.1385 | 0.2174 |
| FDA (8k) | 0.4051 | 0.2656 | 0.4360 |
| Coarse TDA and 8k FDA | 0.0786 | 0.0697 | 0.0666 |

FIG. 11

METHODS AND APPARATUS FOR PERFORMING DIGITAL PREDISTORTION USING TIME DOMAIN AND FREQUENCY DOMAIN ALIGNMENT

BACKGROUND

This relates generally to integrated circuits, and more particularly, to integrated circuits with wireless communications circuitry.

Integrated circuits with wireless communications capabilities typically include amplifying circuits that are used to amplify the power of radio-frequency signals prior to wireless transmission. For example, a radio-frequency power amplifier may receive input signals having an input power level and generate corresponding output signals having an output power level, where the output power level of the output signal is generally greater than the input power level of the input signal. Ideally, the power amplifier exhibits a perfectly linear input-output power transfer characteristic (i.e., an increase in the input power by a certain amount should result in a corresponding predetermined amount of increase in the output power). In practice, however, power amplifiers often exhibit non-linear behavior. When a power amplifier is non-linear, an increase in the input power may result in a corresponding increase in the output power that is less than the predetermined amount.

Such type of non-linearity issues can degrade signal integrity and adversely impact wireless performance. In an effort to mitigate power amplifier non-linearity, predistortion circuitry has been developed. Predistortion circuitry is formed in the signal path leading up to the input of the power amplifier and serves to "predistort" the signals prior to amplification so as to compensate for any non-linear behavior of the radio-frequency power amplifier. In other words, the predistortion circuitry is used to introduce a signal predistortion effect that cancels out with the non-linear signal transfer characteristic of the power amplifier so that signals are properly amplified at the output of the power amplifier.

In order to perform predistortion, the predistortion circuitry is configured to monitor the input signals received at the input of the power amplifier and the output signals generated at the output of the power amplifier. Arranged in this way, the transfer characteristic of the power amplifier can be analyzed. Predistortion operations generally involve some type of signal alignment operation, coefficient computation operation, and predistortion signal filtering operation. The signal alignment operation serves to align the monitored input and output signals so that comparison between the two signals can be properly performed. The coefficient computation operation analyzes the aligned signals and outputs corresponding coefficients that directly control the predistortion signal filtering operation (e.g., the type of filtering or predistortion being introduced is based on the generated coefficients).

In one conventional arrangement, the predistortion circuitry implements only time domain signal alignment. Time domain alignment (TDA) operations involve a coarse time domain alignment step, an upsampling step, a fine time domain alignment step, followed by a downsampling step. Implementing predistortion in this way is fast but requires a significant amount of memory as sampling rate is increased. Moreover, the fine time domain alignment step is sensitive to sampling frequency and requires re-tuning whenever the sampling frequency changes.

In another conventional arrangement, the predistortion circuitry implements only frequency domain signal alignment. Frequency domain alignment (FDA) operations involve a fast Fourier transform (FFT) operation that converts the monitored input and output signals from the time domain to the frequency domain, a single alignment operation in the frequency domain, followed by an inverse FFT operation that converts the aligned signals from the frequency domain back to the time domain. Implementing predistortion in this way does not require as much memory and is less sensitive to sampling frequency compared to the TDA-based predistortion but is costly as the FFT and iFFT operations require substantially more complex processing circuitry and is substantially slower than pure TDA operations.

It would therefore be desirable to provide improved predistortion circuitry that is reasonably fast, memory efficient, and reduced sensitivity to sampling frequency.

SUMMARY

This relates generally to integrated circuits and, more particularly, to integrated circuits with wireless communications circuitry. The wireless communications circuitry on an integrated circuit may include at least a radio-frequency (RF) power amplifier and digital predistortion (DPD) circuitry for predistorting signals prior to amplification. The predistortion circuitry may be configured to compensate for any non-linear characteristics associated with the RF power amplifier. The predistortion circuitry may receive transmit signals and may output a predistorted version of the transmit signals. The power amplifier may receive the predistorted version of the transmit signals and may perform amplification to generate amplified transmit signals.

The digital predistortion circuitry may include a time domain alignment circuit, a frequency domain alignment circuit, an adaption circuit, and a DPD forward path filter. The time domain alignment circuit may have a first input that receives the predistorted transmit signals (e.g., signals received at the input of the power amplifier) and a second input that receives the amplified transmit signals (e.g., signals received at the output of the power amplifier). The time domain alignment circuit may perform time domain cross-correlation on the received predistorted transmit signals and the received amplified transmit signals to produced first aligned signals without performing any upsampling (i.e., by sampling the received signals at a single sampling frequency).

The frequency domain alignment circuit may receive the first aligned signals from the time domain alignment circuit. The frequency domain alignment circuit may perform frequency domain cross-correlation on the first aligned signals to produce second aligned signals. In particular, the frequency domain alignment circuit may be used to perform at least fast Fourier transform operations, matrix multiplication operations, and matrix inverting operations on the first aligned signals. In this way, the time domain alignment circuit may perform "coarse" granularity signal alignment in the time domain while the frequency domain alignment circuit may subsequently perform "fine" granularity signal alignment in the frequency domain.

The adaption circuit may receive the second aligned signals from the frequency domain alignment circuit and may be used to produce corresponding filter coefficients based on a predetermined model associated with the RF power amplifier. Computation of the filter coefficients may involve another matrix inverting operation. If desired, the adaption circuit and the frequency domain alignment circuit may share a common matrix inverting circuit.

The forward path filter may be a finite impulse response filter and may have an input that receives the transmit signals and an output on which the distorted version of the transmit signals is generated. The filter may serve to predistort the transmit signals based on the filter coefficients produced by the adaption circuit.

Further features of the present invention, its nature and various advantages will be more apparent from the accompanying drawings and the following detailed description.

BRIEF DESCRIPTION OF THE DRAWINGS

FIG. 10 is a diagram that compares the amount of resources and the performance among different types of predistortion circuitry in accordance with an embodiment of the present invention.

FIG. 11 is a diagram showing the standard deviation of the difference in magnitude of aligned signals as a function of sampling frequency in accordance with an embodiment of the present invention.

DETAILED DESCRIPTION

Embodiments of the present invention relate to integrated circuits with wireless communications circuitry. It will be recognized by one skilled in the art, that the present exemplary embodiments may be practiced without some or all of these specific details. In other instances, well-known operations have not been described in detail in order not to unnecessarily obscure the present embodiments.

Figure 1:
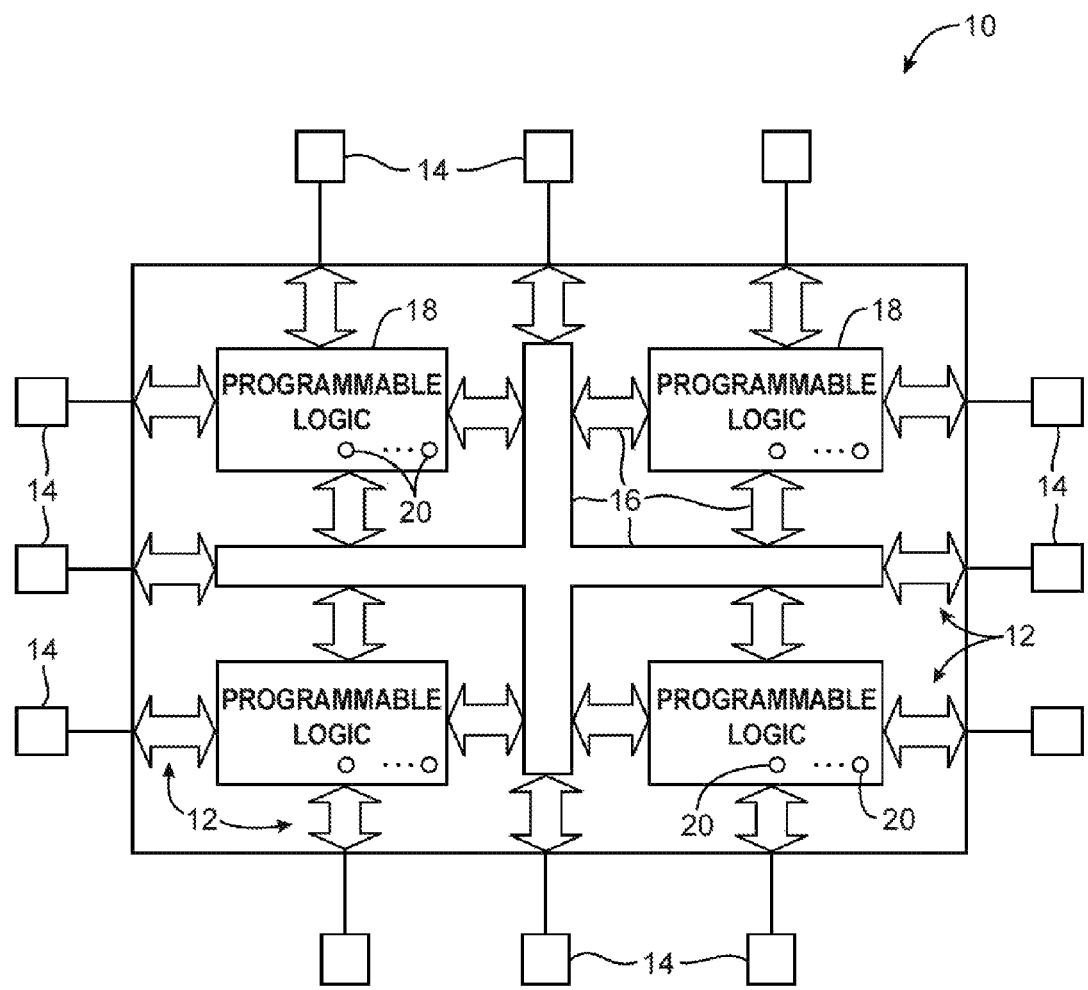
FIG. 1 is a diagram of an illustrative programmable integrated circuit in accordance with an embodiment of the present invention.

An illustrative integrated circuit of the type that may be provided with wireless communications capabilities is shown in FIG. 1. As shown in FIG. 1, integrated circuit 10 may contain memory elements 20. Memory elements 20 may be loaded with configuration data to configure programmable transistors such as pass transistors (sometimes referred to as pass gates or pass gate transistors) in programmable circuitry (programmable logic) 18.

Because memory elements 20 may be used in storing configuration data for programmable logic 18, memory elements 20 may sometimes be referred to as configuration random-access memory elements (CRAM). Integrated circuit 10 may be configured to implement custom logic functions by configuring programmable logic 18, so integrated circuit 10 may sometimes be referred to as a programmable integrated circuit.

As shown in FIG. 1, programmable integrated circuit 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 may include fixed interconnects (conductive lines) and programmable interconnects (i.e., programmable connections between respective fixed interconnects).

Programmable logic 18 may include combinational and sequential logic circuitry. Programmable logic 18 may be configured to perform a custom logic function. The programmable interconnects associated with interconnection resources 16 may be considered to form a part of programmable logic 18.

When memory elements 20 are loaded with configuration data, the memory elements each provide a corresponding static control output signal that controls the state of an associated logic component in programmable logic 18. The memory element output signals may, for example, be used to control the gates of metal-oxide-semiconductor (MOS) transistors such as n-channel metal-oxide-semiconductor (NMOS) pass transistors in programmable components such as multiplexers, logic gates such as AND gates, NAND gates, etc. P-channel transistors (e.g., a p-channel metal-oxide-semiconductor pass transistor) may also be controlled by output signals from memory elements 20, if desired. When a memory element output that is associated with an NMOS pass transistor is high, the pass transistor controlled by that memory element is turned on and passes logic signals from its input to its output. When the memory element output is low, an NMOS pass transistor is turned off and does not pass logic signals. P-channel metal-oxide-semiconductor (PMOS) pass transistors are turned on when the signal that is applied to its gate from the output of a memory element is low (e.g., 0 volts) and are turned off when the output of the memory element is high (i.e., the polarity for NMOS and PMOS control signals is reversed).

Configuration random-access memory elements 20 may be arranged in an array pattern. There may be, for example, millions of memory elements 20 on integrated circuit 10. During programming operations, the array of memory elements is provided with configuration data. Once loaded with configuration data, memory elements 20 may selectively control (e.g., turn on and off) portions of the circuitry in the programmable logic 18 and thereby customize the circuit functions of circuit 10.

The circuitry of programmable integrated circuit 10 may be organized using any suitable architecture. As an example, the circuitry of programmable integrated circuit 10 may be organized in a series of rows and columns of programmable logic blocks (regions) each of which contains multiple smaller logic regions. The logic resources of integrated circuit 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the circuitry of programmable integrated circuit 10 may be arranged in more levels or layers in which multiple large regions are interconnected to form still larger portions of logic. Still other device arrangements may use logic that is not arranged in rows and columns.

Figure 2:
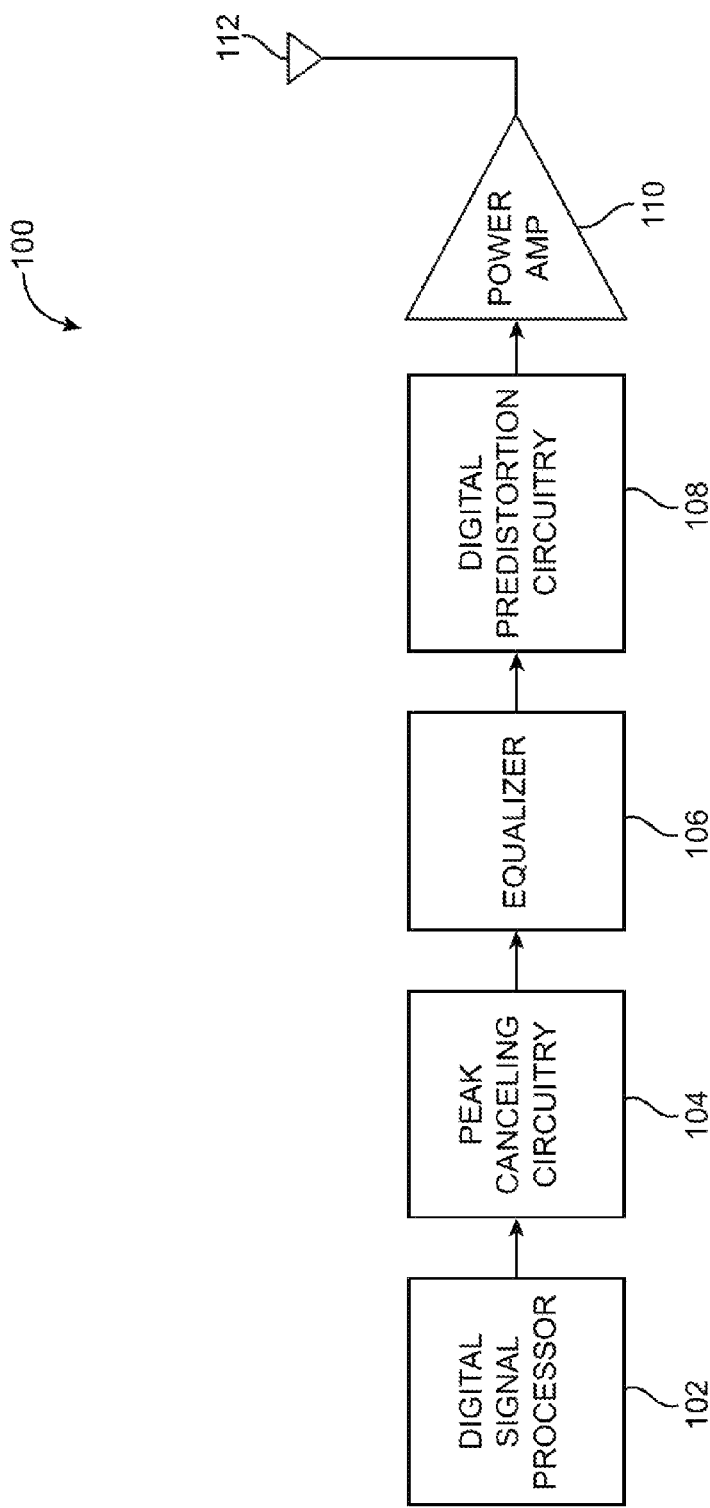
FIG. 2 is a diagram of illustrative wireless communications circuitry in a transmit path in accordance with an embodiment of the present invention.

The example of FIG. 1 in which device 10 is described as a programmable integrated circuit is merely illustrative and does not serve to limit the scope of the present invention. The method and apparatus described herein may be incorporated into any suitable circuit. In one suitable embodiment of the present invention, integrated circuits include wireless communications circuitry for supporting radio-frequency communications. As shown in FIG. 2, wireless communications circuitry such as wireless communications circuitry 100 may include a digital signal processor 102 (e.g., a digital baseband processor), peak canceling circuitry such as peak canceller 104, an equalizing circuit such as equalizer 106, digital predistortion (DPD) circuitry 108, a radio-frequency (RF) amplifying circuit such as RF power amplifier 110, and an antenna 112.

Baseband processor 102 may be used to handle raw and processed data associated with wireless (antenna) performance metrics for received signals such as received power, transmitted power, frame error rate, bit error rate, channel quality measurements based on signal-to-interference ratio (SINR) and signal-to-noise ratio (SNR) information, channel quality measurements based on signal quality data, information on whether responses (acknowledgements) are being received from a cellular telephone tower corresponding to requests from the electronic device, information on whether a network access procedure has succeeded, information on how many re-transmissions are being requested over a cellular link between the electronic device and a cellular tower, information on whether a loss of signaling message has been received, information on whether paging signals have been successfully received, and other information that is reflective of the performance of wireless circuitry 100.

When wireless communications circuitry 100 is transmitting radio-frequency signals, processor 102 may generate digital data (e.g., baseband signals) that is fed to peak canceling circuitry 104. Peak cancelling circuitry 112 may be used to reduce the dynamic range of the baseband signals (e.g., for performing crest factor reduction operations). Signals generated at the output of peak cancelling circuitry 104 may be fed through equalizer 106 to compensate for any signal attenuation at high frequencies. Signals generated at the output of equalizer 106 may be fed through DPD circuitry 108 and power amplifier 110 to antenna 112 for wireless transmission.

The circuitry shown in FIG. 2 is merely illustrative and does not serve to limit the scope of the present invention. Antenna 112 may also be coupled to receiver circuitry (not shown) for processing signals received using antenna 112. Processor 102, peak canceling circuitry 104, equalizer 106, and digital predistortion circuitry 108 may process digital signals at the baseband. Power amplifier 110 is sometimes considered to be part of a radio-frequency front end module that transmits analog signals at radio-frequency bands. The RF front end module may also include circuitry such as matching circuits, band-pass filters, mixers (e.g., frequency up-converters and down-converters), low noise amplifiers (LNAs), data converters (e.g., digital-to-analog converters and analog-to-digital converters), and other circuitry for processing signals that are transmitted and received via antenna 12.

Figure 3:
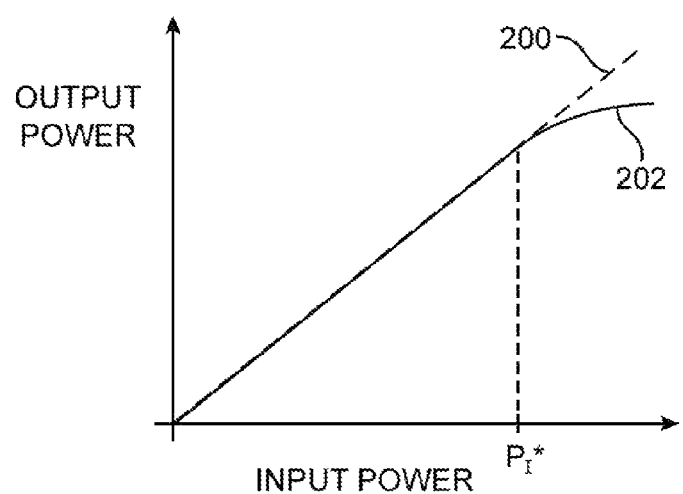
FIG. 3 is an exemplary diagram plotting output power level versus input power level of a radio-frequency power amplifier in accordance with an embodiment of the present invention.

Ideally, radio-frequency power amplifier 110 exhibits a perfectly linear power response. FIG. 3 plots output power level versus input power level for an illustrative radio-frequency power amplifier. Response line 200 may represent an ideal power characteristic, whereas line 202 may represent an actual power characteristic of the power amplifier in practice. As shown in FIG. 3, line 200 may exhibit a constant slope across all input power levels (i.e., any increase in input power results in a corresponding increase in output power by a predetermined amount).

It is, however, challenging to manufacture power amplifiers that exhibit perfectly linear power transfer characteristics. In practice, increases in input power levels may not always increase the output power by the predetermined amount. As shown by line 202 in FIG. 3, the slope of line 202 may deviate from the desired slope of line 200 after a certain power level $P_I^*$. This undesired deviation may result in a reduction in the gain provided by the power amplifier at input power levels greater than $P_I^*$ and may therefore sometimes be referred to as gain compression. In general, radio-frequency power amplifier 110 in device 10 may exhibit gain compression and/or may deviate from the ideal transfer characteristic in any other way.

Figure 4:
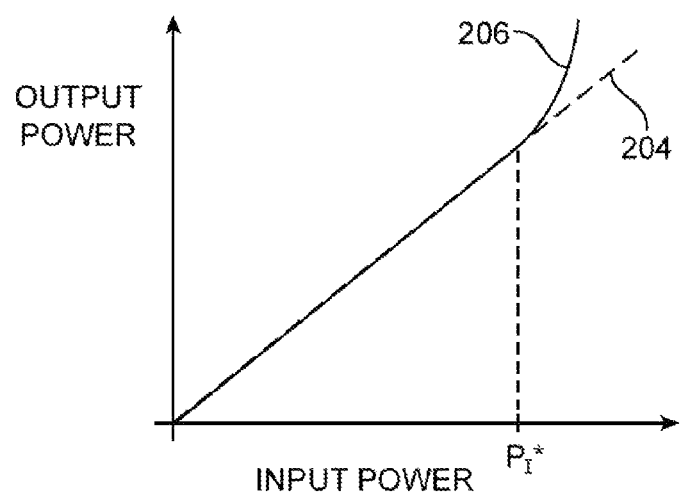
FIG. 4 is an exemplary diagram plotting output power level versus input power level of digital predistortion circuitry in accordance with an embodiment of the present invention.

To counteract such types of undesirable non-linear behavior, digital predistortion (DPD) circuitry 108 may be used to introduce signal distortion that compensates for undesired deviation(s) from the ideal power transfer characteristic. FIG. 4 plots output power level versus input power level for an exemplary predistortion circuit. Line 204 may exhibit a constant slope of one, whereas line 206 may exhibit the actual power characteristic of the predistortion circuit. For all signals that are received with the predistortion circuit and that have power levels less than or equal to $P_I^*$, these signals may be passed through to the output of the predistortion circuit without any amplification nor attenuation. For all signals that are received with the predistortion circuit and that have power levels greater than $P_I^*$, these signals may be provided with an appropriate amount of gain to compensate for the gain compression associated with the power amplifier as described in connection with FIG. 3.

Line 206 of FIG. 4 is merely illustrative. In general, digital predistortion circuitry 108 may exhibit a power transfer curve having an inverse relationship with that associated with power amplifier 110 (e.g., a positive deviation in line 202 from line 200 at a given first input power level may be accompanied by a negative deviation in line 206 from line 204 at the given first input power level, whereas a negative deviation in line 202 from line 220 at a given second input power level may be accompanied by a positive deviation in line 206 from line 204 at the given second input power level).

Figure 5:
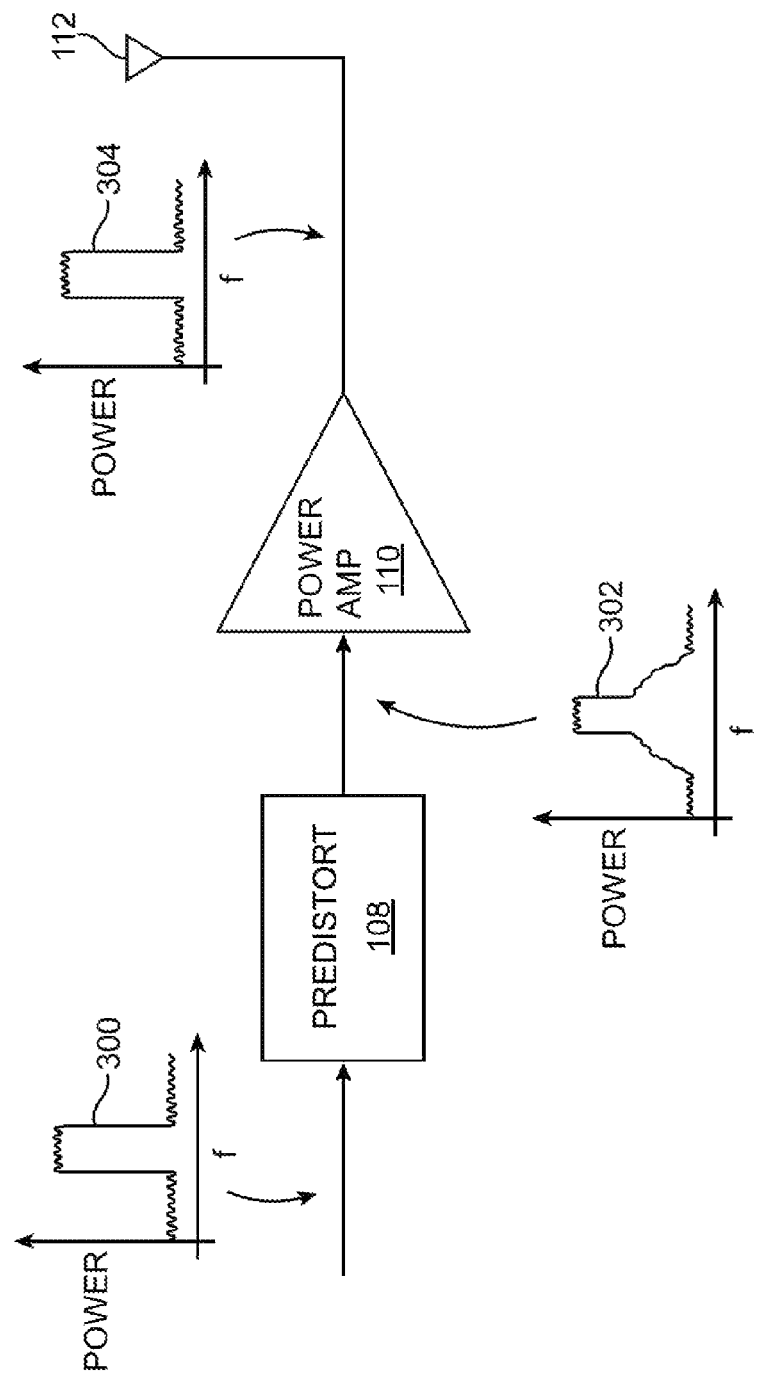
FIG. 5 is a diagram illustrating how predistortion circuitry can be used to compensate for non-linearity issues associated with a radio-frequency power amplifier in accordance with an embodiment of the present invention.

FIG. 5 is a diagram illustrating how predistortion circuitry 108 can be used to compensate for non-linearity issues associated with radio-frequency power amplifier 110. As shown in FIG. 5, a signal arriving at the input of predistortion circuitry 108 may have a frequency response 300. Circuitry 108 may serve to "predistort" the signal so that the signal generated at the output of DPD circuitry 108 exhibits a frequency response 302 that is different than frequency response 300.

Power amplifier 110 may receive this predistorted signal and generate an amplified version of the received signal to the antenna. Due to non-idealities associated with power amplifier 110, the predistorted signal is not only amplified but also distorted by the non-linear power transfer characteristic of power amplifier 110. If predistortion circuitry 108 is properly configured, signals generated at the output of power amplifier 110 will produce a frequency response 304 that is substantially similar to that of the desired frequency response 300 of the original signal prior to predistortion and amplification. In general, predistortion can be used to correct for any undesired magnitude and phase deviations associated with power amplifier 110, thereby improving power amplifier efficiency and wireless performance.

Figure 6:
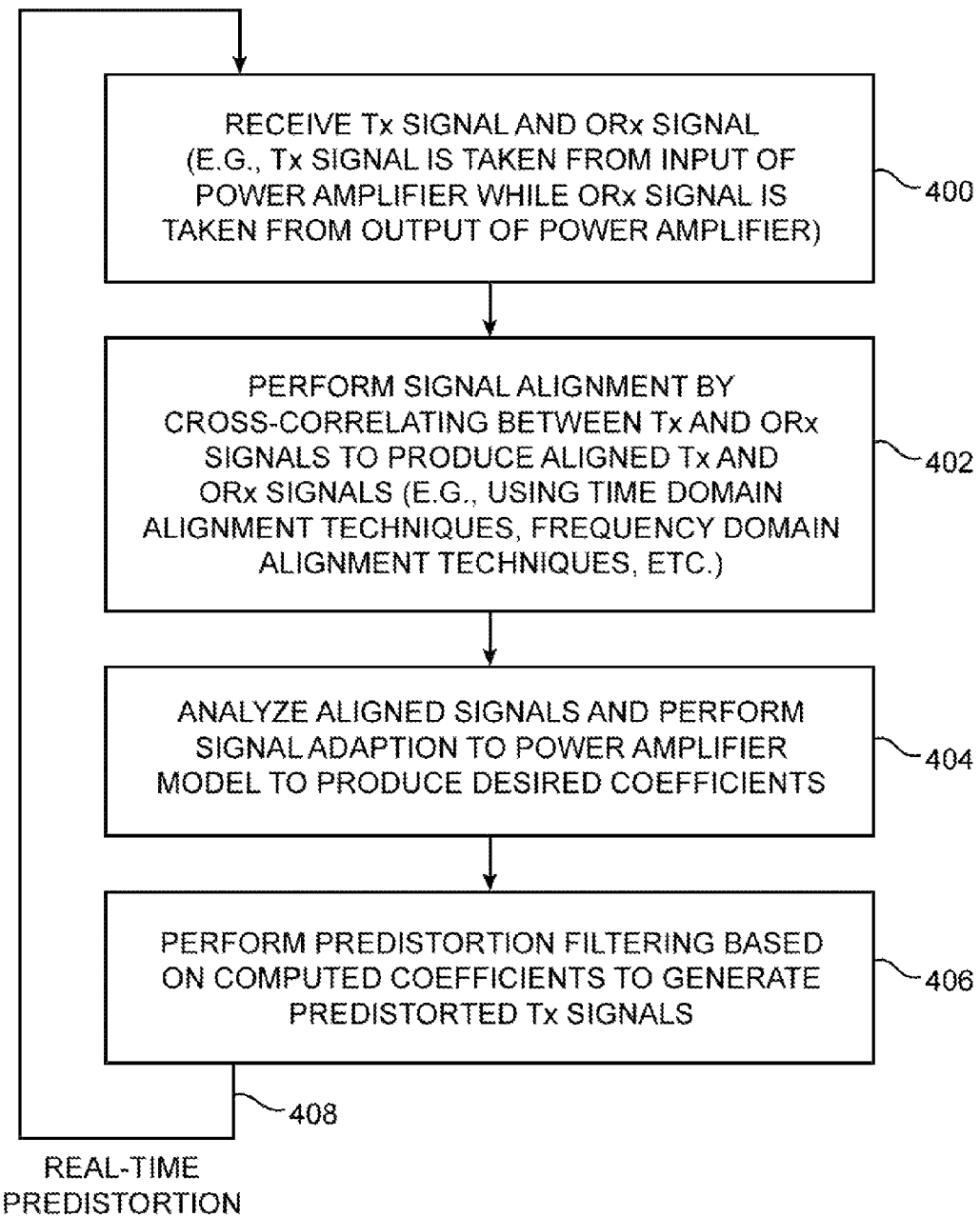
FIG. 6 is a flow chart of illustrative steps involved in performing digital predistortion in accordance with an embodiment of the present invention.

FIG. 6 shows illustrative steps involved in performing signal predistortion with circuitry 108. At step 400, circuitry 108 may have a first input configured to receive signals that are to be amplified (sometimes referred to herein as transmit or "Tx" signals) and a second input configured to receive signals that have been amplified (sometimes referred to herein as observed or "ORx" signals). The Tx signal may be taken from the input of power amplifier 110, whereas the ORx signal may be taken from the output of power amplifier 110.

To properly obtain the power transfer profile of radio-frequency power amplifier 110, the observed ORx signals have to be compared with the arriving Tx signals. In order to be able to properly compare the two signals, any time difference between the Tx and ORx signals will have to be eliminated (e.g., by aligning the ORx signal with respect to the Tx signal). At step 402, the Tx signal may be cross-correlated with the ORx signal to align the Tx and ORx signals to one another (i.e., to produce aligned Tx and ORx signals). Alignment may be performed via time domain alignment (TDA) techniques, frequency domain alignment (FDA) techniques, a combination of TDA and FDA techniques, and/or other suitable signal alignment operations.

At step 404, circuitry 108 may analyze the aligned Tx and ORx signals and may perform signal adaptation operations according to a given power amplifier model to produce corresponding coefficients. The given power amplifier model may be associated with the particular power amplifier 110 included within device 10 and may be represented by a mathematical expression such as a polynomial including but not limited to a Taylor series, a Volterra series, and/or other suitable mathematical representation. The aligned Tx and ORx signals may be fitted to the power amplifier model using a least squares algorithm, which may require a matrix inversion operation. The coefficients computed using the least squares algorithm may correspond to the desired coefficients for the power amplifier model.

At step 406, circuitry 108 may have a filter circuit (e.g., a finite impulse response circuit) that filters or predistorts the transmit signals based on the computed coefficients. The amount or type of predistortion introduced by circuitry 108 may depend on the coefficients computed during the signal adaptation operation at step 404. Processing may loop back to step 400 to perform real-time predistortion on a continuous basis during normal operation of device 10, as indicated by path 408.

Traditionally, the signal alignment operation of step 402 is performed via only a time domain alignment scheme or only a frequency domain alignment scheme. In the conventional arrangement in which a pure time domain alignment operation is carried out, the predistorter performs a coarse time domain alignment, upsamples the Tx and ORx signals, performs a fine time domain alignment on the upsampled signals, and then downsamples the Tx and ORx signals in that order. Alignment based purely on TDA is fast but requires a substantial amount of memory to process data with higher sampling rates (i.e., a high upsampling factor multiplies the amount of memory that is required to store all the sampled data).

In the conventional arrangement in which a pure frequency domain alignment operation is carried out, the predistorter performs a fast Fourier transform (FFT) to convert the Tx and ORx signals from the time domain to the frequency domain, cross-correlates the converted Tx and ORx signals, computes a corresponding phase offset between Tx and ORx, aligns the Tx and ORx signals based on the computed phase offset, and performs an inverse FFT to convert the aligned Tx and ORx signals from the frequency domain back to the time domain in that order. Alignment based purely on FDA does not require as much memory as the TDA implementation but is relatively slow (i.e., more than a 1000 times slower than the speed of pure TDA) and is expensive in terms of processing requirements as the FFT and iFFT operations require a substantial amount of multipliers and other digital signal processing blocks.

In an embodiment of the present invention, predistortion circuitry 108 that performs signal alignment using both time domain alignment and frequency domain alignment techniques is provided. During a first alignment phase, a coarse time domain alignment can initially be performed without any upsampling to roughly reduce any existent phase offset between signals Tx and ORx.

During a second alignment phase after coarse TDA is complete, a reduced resolution FFT (relative to that of the pure FDA approach) may be performed to correct for any remaining phase offset. The use of the reduced resolution FFT instead of the fine TDA dramatically reduces the memory requirement since no upsampling needs to be performed. The resolution/complexity of the FFT can be reduced since the coarse TDA performed during the first alignment phase would have already corrected for most of the phase delay. The use of a reduced complexity FFT can help to substantially reduce the time needed for the FDA alignment operation (relative to that of the pure FDA approach). Performing digital predistortion using a combined TDA and FDA approach can therefore provide a reasonable balance between memory requirement and alignment speed.

Figure 7:
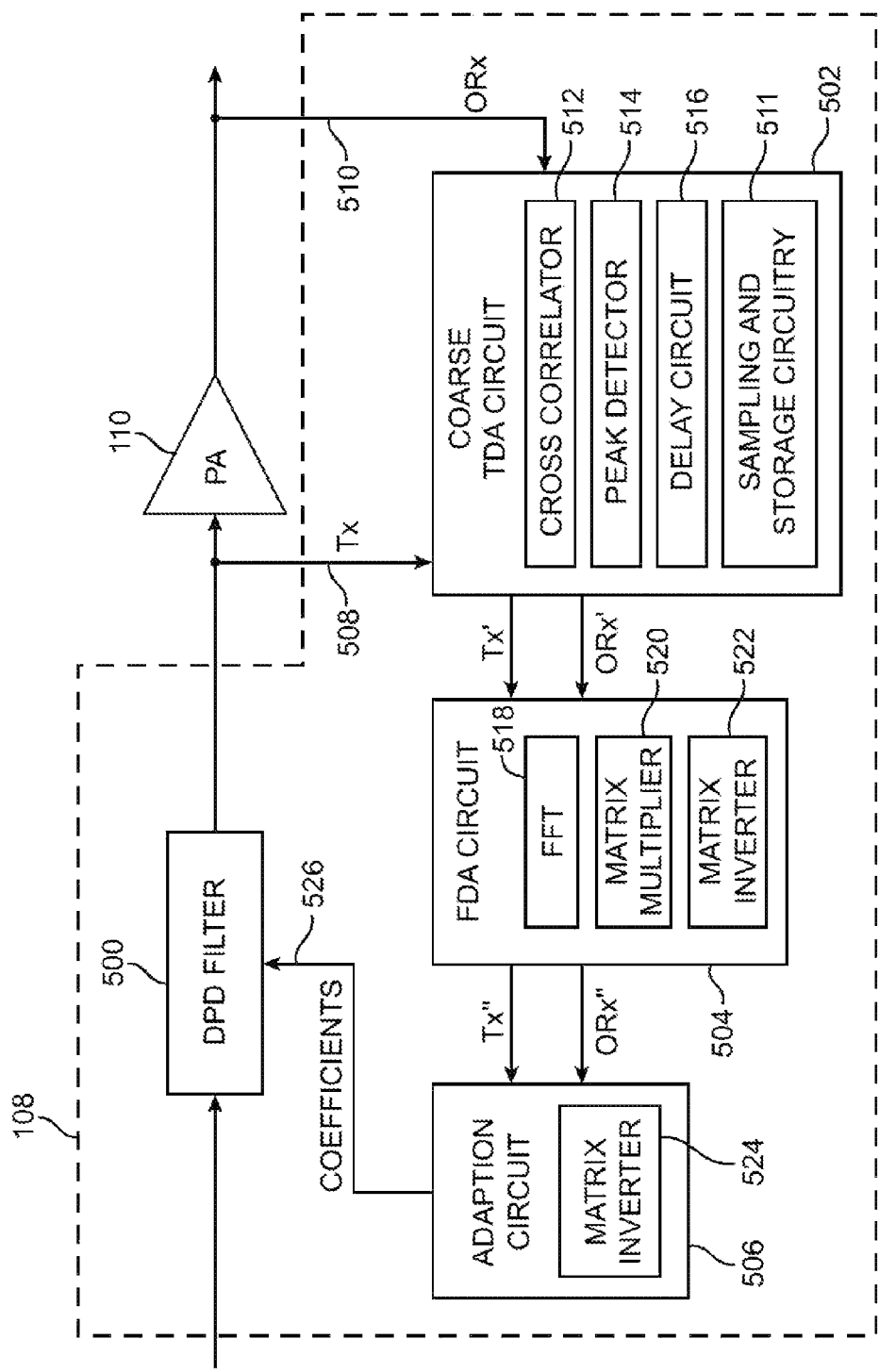
FIG. 7 is a diagram of illustrative digital predistortion circuitry that includes a time domain alignment circuit and a frequency domain alignment circuit in accordance with an embodiment of the present invention.

FIG. 7 shows one suitable arrangement of digital predistortion circuitry 108 operable to perform time domain alignment and frequency domain alignment. As shown in FIG. 7, predistortion circuitry 108 may include a digital predistortion (DPD) forward path filter such as filter 500, a time domain alignment circuit such as coarse TDA circuit 502, a frequency domain alignment circuit such as FDA circuit 504, and an adaption circuit such as adaption circuit 506.

Digital predistortion filter 500 may have a first input configured to receive equalized baseband signals from equalizer 106 (see, FIG. 2), a second input, and an output on which a predistorted version of the equalized baseband signals is provided. Filter 500 may, as an example, be a finite impulse response (FIR) filter that is used to convolve the equalized baseband signals received at its first input with an impulse response received at its second input. The impulse response may be represented using filter coefficients (sometimes referred to as "tap weights"). The number of delay taps implemented by filter 500 may depend on the particular mathematical expression that is used to model the response of power amplifier 110 (i.e., the order of filter 500 may depend on the complexity of a predetermined power amplifier model). Other front-end circuitry (not shown for clarity) may be interposed between DPD filter 500 and power amplifier 110 to convert the predistorted signals from the baseband to radio-frequencies so that the radio-frequency signals can be amplified by power amplifier 110 and wirelessly transmitted.

In order to properly characterize the power transfer response of RF power amplifier 110, predistortion circuitry 108 has to compare the signals at the input of power amplifier 110 (i.e., the Tx signals) to the signals at the output of power amplifier 110 (i.e., the ORx signals). In particular, coarse time domain alignment circuit 502 may have a first input that receives the Tx signal over path 508 and a second input that receives the ORx signal over path 510. Signals ORx generated at the output of power amplifier 110 exhibit not only amplified magnitudes but are also delayed in time with respect to the Tx signals. Any amount of time difference (e.g., phase delay) between the Tx and ORx signals should be reduced so that the two signals can be properly compared. TDA circuit 502 and FDA circuit 504 may be coupled in series and may be used to align the Tx and ORx signals so that any difference observed during the comparison of the input and output power amplifier signals is only reflective of the linearity and not the phase delay associated with power amplifier 110.

In the example of FIG. 7, TDA circuit 502 may include sampling and storage circuitry 511, a cross correlator 512, a peak detector 514, and a delay circuit 516. Circuitry 511 may be used to obtain 32 thousand samples for the Tx signal and 32 thousand samples for the ORx signal using a nominal sample rate of 61.44 Msps (as an example). The combined 64 thousand samples may be stored as 64K bytes of memory data in circuitry 511. These numbers are merely illustrative. If desired, sampling and storage circuitry 511 may be used to obtain any number of Tx and ORx samples using any suitable sampling rate and may include a sufficient amount of memory to store the sampled data.

Circuit 512 may be used to perform cross-correlation on signals Tx and ORx. Cross-correlation may be a measure of similarity between two waveforms as a function of any time delay existent between the two waveforms. In this particular scenario, ORx may be a delayed or "time-lagged" version of Tx. Cross-correlating may involve shifting the ORx signal along the time axis and calculating the integral of the product of Tx and ORx at each point in time as ORx is being shifted. When the two waveforms match or coincide, the resulting cross-correlated value is maximized. In other words, the peaks in the cross-correlated waveform correspond to the amount of time delay that is present between signals Tx and ORx.

Peak detector 514 may be used to determine the location of these peaks so as to identify the amount of phase delay between signals Tx and ORx. This information can then be used by delay circuit 516 to shift a selected one of signals Tx and ORx by the identified amount of phase delay to produce coarsely aligned signals Tx' and ORx'.

For example, consider a scenario in which signal ORx is delayed by 23 microseconds with respect of signal Tx. Coarse TDA circuit may be able to detect this time delay but may only have enough resolution to reduce the time lag between Tx and ORx by 20 microseconds. In particular, delay circuit 516 may delay ORx by a nominal propagation delay of 1 microsecond to produce ORx' and may delay Tx by a total delay of 21 microseconds (20 µs as determined by peak detector 514 plus 1 µs nominal propagation delay) to produce Tx'. Since no upsampling has been performed, a 3 microsecond delay between Tx' and ORx' may still remain after the coarse time domain alignment of circuit 502. If desired, the resolution of the coarse alignment provided by TDA circuit 502 can be further enhanced by increasing the sampling rate, which would require more memory space to store the increased amount of sampled data.

FDA circuit 504 may be used to further reduce any residual phase offset between signals Tx' and ORx'. In the example of FIG. 7, FDA circuit 504 includes a fast Fourier transform (FFT) circuit 518 capable of performing FFT and inverse FFT (iFFT) operations, a matrix multiplication circuit 520, and a matrix inverting circuit 522. FFT circuit 518 may first be used to convert signals Tx' and ORx' from the time domain to the frequency domain. In particular, circuit 518 may be a lower complexity FFT circuit relative to those that are used in conventional pure FDA-based predistortion circuitry.

For example, while the conventional FFT circuit may perform a 32K fast Fourier transform on all 32K samples of Tx/ORx, FFT circuit 518 of DPD circuitry 108 may instead perform an 8K fast Fourier transform on only a subset of Tx' and ORx' (e.g., the reduced complexity FFT circuit 518 may perform FFT on a fraction of the sampled data received from coarse TDA circuit 502). In this example, FFT circuit 518 will convert every fourth sampled data point. This is merely illustrative. FFT circuitry 518 may be configured to convert any suitable fraction of the sampled information.

Once signals Tx' and ORx' have been converted into the frequency domain, frequency domain cross-correlation may be performed by multiplying the converted Tx' signal with the converted ORx' signal (e.g., by performing a matrix multiplication operation in the frequency domain using matrix multiplier 520). Matrix inverter 504 may then perform a matrix inversion on the resulting product to compute any residual phase offset between Tx' and ORx'.

Delay circuit 517 may then delay a selected one of Tx' and ORx' in the frequency domain to further reduce the residual phase offset. FFT circuit 518 may then convert the signals that have been aligned using delay circuit 517 from the frequency domain back into the time domain to produce finely aligned signals Tx" and ORx". Signals Tx" and ORx" generated at the output of FDA circuit 504 should be aligned to each other within a predetermined tolerance or within a margin of error so that predistortion circuitry 108 can operate satisfactorily according to design criteria. The resolution of the fine alignment provided by FDA circuit 504 can be further enhanced by increasing the resolution of FFT circuit 518 (e.g., by performing FDA alignment on a greater fraction of the sampled data).

Adaption circuit 506 may receive the finely aligned signals Tx" and ORx" from FDA circuit 504 and may be used to characterize the relationship between Tx" and ORx". Now that the input power amplifier signal Tx" and the output power amplifier signal ORx" have been aligned, the two signals can be analyzed to determine the power transfer characteristic of power amplifier 110. In particular, adaption circuit 506 may use matrix inverter 524 to perform a division operation to generate the coefficients associated with the impulse response of filter 500. The impulse response coefficients may be fed from the output of adaption circuit 506 to the second input of forward path DPD filter 500 via path 526. The coefficients computed using this approach can be used by filter 500 to predistort the forward path transmit signals received at the first input of filter 500 in a way that compensates for any detected non-linearity associated with power amplifier 110.

Figure 8:
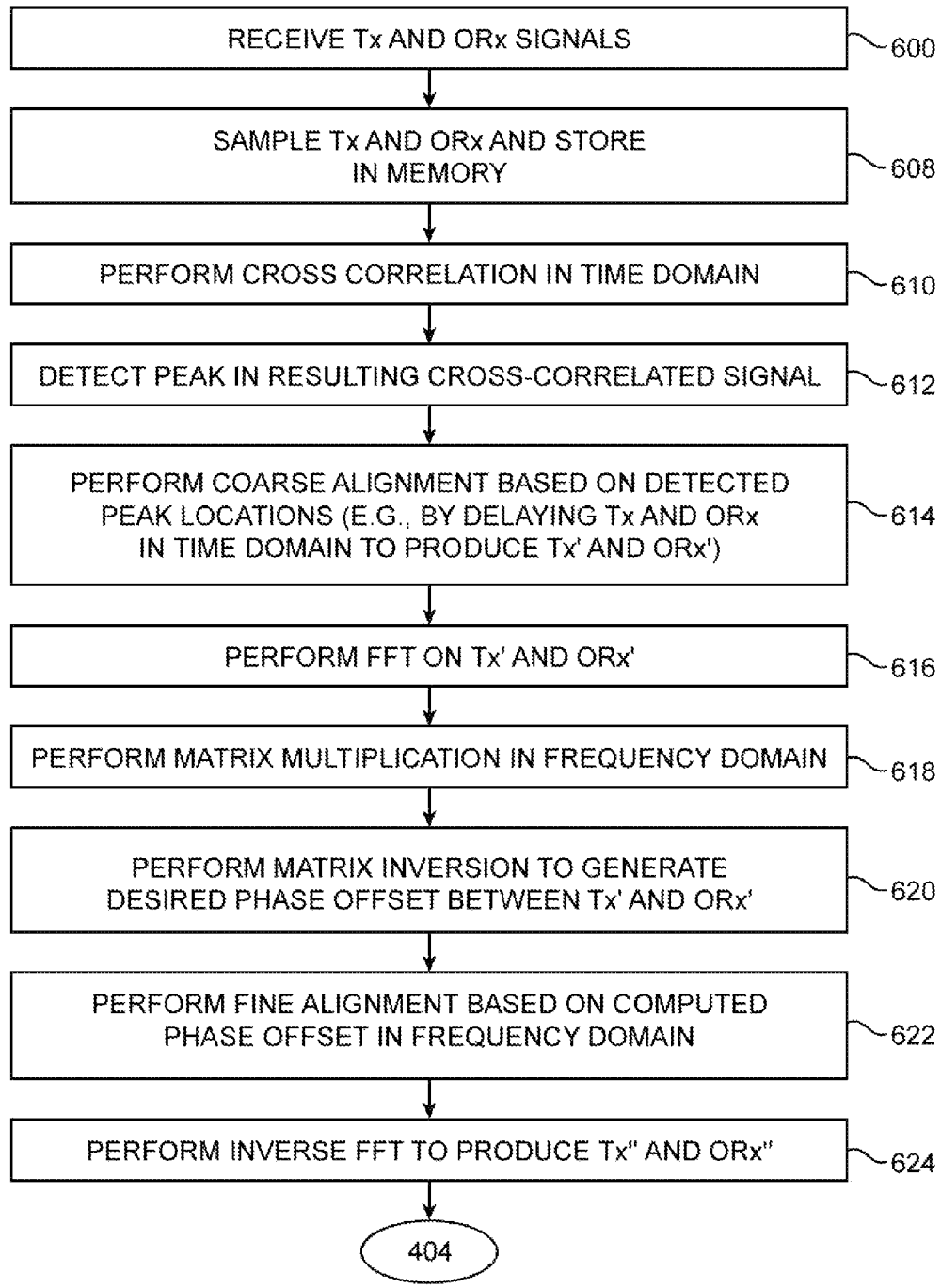
FIG. 8 is a flow chart of illustrative steps involved in operating the digital predistortion circuitry of FIG. 7 in accordance with an embodiment of the present invention.

FIG. 8 is a flow chart of illustrative steps involved in operating predistortion circuitry 108 of the type described in connection with FIG. 7. At step 600, coarse time domain alignment circuit 502 may receive the power amplifier input signals Tx and the power amplifier output signals ORx via paths 508 and 510, respectively. At step 608, sampling and storage circuitry 511 may be used to sample the Tx and ORx signals using a nominal data sampling rate; the sampled Tx and ORx signals may be stored in memory within circuitry 511.

At step 610, cross-correlation may be performed in the time domain using cross correlator 512. At step 612, the peaks in the resulting cross-correlated signal may be detected using peak detector 514. A step 614, coarse alignment may be performed based on the detected peak locations by shifting at least one of signals Tx and ORx in the time domain to produce coarsely aligned signals Tx' and ORx' at the output of TDA circuit 502.

Frequency domain alignment circuit 504 may receive signals Tx' and ORx' and further reduce any residual phase offset between the two signals. At step 616, fast Fourier transform circuit 518 may be used to perform FFT to convert signals Tx' and ORx' from the time domain to the frequency domain. At step 618, circuit 504 may perform frequency domain cross-correlation by computing the matrix product of Tx' and ORx' in the frequency domain using matrix multiplier 520.

At step 620, a matrix inversion may be performed using matrix inverter 522 to estimate the residual phase offset between Tx' and ORx'. At step 622, fine alignment may be performed based on the estimated residual phase offset by shifting at least one of signals Tx' and ORx' in the frequency domain by the residual phase offset computed by matrix inverter 522. At step 624, fast Fourier transform circuit 518 may be used to perform inverse FFT on the shifted Tx' and ORx' signals to produce finely aligned signals Tx" and ORx" at the output of FDA circuit 504. Processing may continue to step 404 to perform the remainder of the digital predistortion operation (see, e.g., FIG. 6).

Referring back to FIG. 7, one may notice that adaption circuit 506 and FDA circuit 504 both include a dedicated matrix inverting circuit (e.g., FDA circuit 504 includes matrix inverter 522, whereas adaption circuit 506 includes matrix inverter 524). During operation of FDA circuit 504 prior to generating Tx" and ORx", adaption circuit 506 is idle. Similarly, during operation of adaption circuit 506 prior to generating the impulse response coefficients on output 526, FDA circuit 504 may be placed in an inactive state. In other words, FDA circuit 504 and adaption circuit 506 can be operated in series, only one of which should be switched into use at any given point in time.

Figure 9:
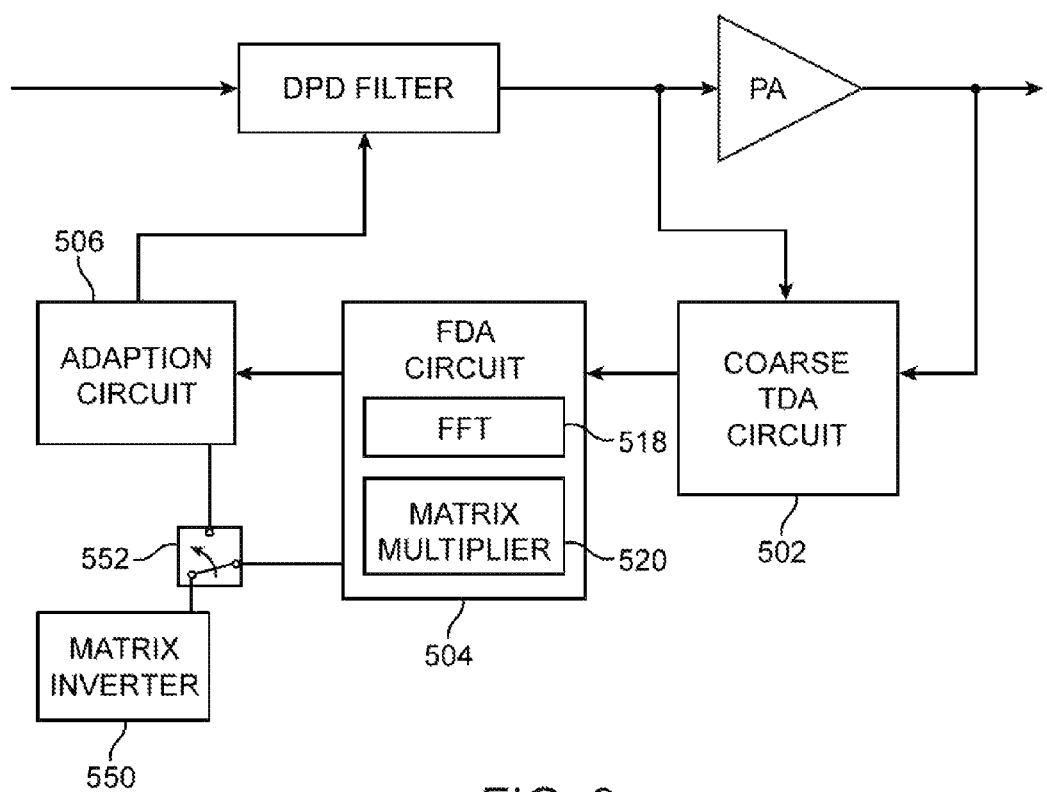
FIG. 9 is a diagram of illustrative digital predistortion circuitry having a time domain alignment and a frequency domain alignment circuit that share a common matrix inverting circuit in accordance with an embodiment of the present invention.

As a result, only one of matrix inverters 522 and 524 will be in use at any given point in time. In certain embodiments, it may be desirable to share a single matrix inverting circuit between FDA circuit 504 and adaption circuit 506 to help reduce the amount of digital processing modules (e.g., multipliers) that is used within predistortion circuitry 108. For example, FIG. 9 shows another suitable arrangement of the digital predistortion circuitry in which a single matrix inverter 550 is multiplexed between FDA circuit 504 and adaption circuit 506. As shown in FIG. 9, matrix inverter 550 may be coupled to FDA circuit 504 and adaption circuit 506 via a switching circuit 552.

In a first time period during which FDA circuit 504 is active and adaption circuit 506 is inactive, switch 552 may be placed in a first position that couples matrix inverter 550 to FDA circuit 504 while decoupling the matrix inverter from adaption circuit 506. In a second time period during which FDA circuit 502 is idle and adaption circuit 506 is in use, switch 552 may be placed in a second position that couples matrix inverter 550 to adaption circuit 506 while decoupling the matrix inverter from FDA circuit 504. Used in this way, matrix inverter 550 may be considered to be part of both the FDA circuit and the adaption circuit.

Switch 552 in FIG. 9 may merely be a schematic representation of how matrix inverter 550 is used in conjunction with circuits 504 and 506 (i.e., matrix inverter 550 need not be coupled to circuits 504 and 506 via a two-pole switch). As another example, matrix inverter 550 may have two sets of inputs and outputs, where information is conveyed between matrix inverter 550 and FDA circuit 504 via a first set of inputs and outputs during a first phase and where information is conveyed between matrix inverter 550 and adaption circuit 506 via a second set of inputs and outputs during a second phase. If desired, other ways of sharing matrix inverter 550 between the FDA function and the RF power amplifier model adaptation function can be used by DPD circuitry 108.

As mentioned previously, digital predistortion circuitry that implements both time domain alignment and frequency domain alignment may provide a desirable tradeoff between memory efficiency and alignment speed. FIG. 10 is a table showing the amount of memory, the number of digital signal processing (DSP) modules, and the alignment latency that is required for the different DPD alignment architectures. The number of DSP modules required may be proportional to the number of multipliers needed to perform the different functions (e.g., matrix multiplication and inversion).

The illustrative values in FIG. 10 are based on the assumption that 32K samples are taken for each of the TX and ORx signals and that each FFT and iFFT operation takes 64K cycles. As shown in FIG. 10, the conventional pure time domain alignment based DPD architecture that performs both coarse and fine alignment in the time domain may require 2M bytes of memory (assuming an upsampling interpolation factor of 32), 15 DSP modules (assuming each up/down sampler uses six multipliers and assuming cross-correlation uses three multipliers), and can be completed in approximately 15 clock cycles. Even though the speed of the conventional TDA-based DPD circuit is relatively fast, the amount of memory that is required to store all the upsampled data may be undesirably high.

Referring still to FIG. 10, the conventional pure frequency domain alignment based DPD architecture that performs phase alignment only in the frequency domain may require only 64K bytes of memory and 55 DSP modules, but is completed after more than 130,000 cycles. Even though the amount of memory that is required to store all the sampled data for the conventional FDA-based DPD circuit is relatively low, the associated latency is undesirably high.

In contrast, digital predistortion circuitry 108 that implements a coarse time domain alignment followed by a reduced-complexity frequency domain alignment may require only 64K bytes of memory, 54 DSP modules, and can be completed in approximately 33,000 cycles. In this example, it is assumed that the reduced-complexity FFT and iFFT takes only 16K cycles instead of 64K cycles, which reduces the latency by a factor of four. If desired, the speed increase can be improved by any suitable factor by adjusting the resolution of FFT circuit 518. In this implementation, the amount of memory that is required to store the sampled data is substantially lower than the conventional TDA-based architecture and the alignment latency is also substantially lower than the conventional FDA-based architecture. The number of DSP modules can be further reduced by sharing the matrix inverter between FDA circuit 504 and adaption circuit 506 as described in connection with FIG. 9. This architecture that involves both TDA and FDA operations would therefore be desirable for applications that have both memory and speed constraints.

FIG. 11 is a table comparing the performance of the various alignment techniques in terms of the standard deviation of the difference between signals Tx and ORx after alignment (i.e., the difference in magnitude between Tx" and ORx"). The standard deviation values $\sigma$ for the different alignment techniques are plotted across different sampling frequencies. In particular, the standard deviation values measured at sampling rates of 61.44 MHz (S), 30.72 MHz (S/2), and 20.48 MHz (S/3) are shown in FIG. 11.

As shown in FIG. 11, a course TDA only operation would yield σ values of 0.0619, 0.1402, and 0.1391 corresponding to sampling rates S, S/2, and S/3, respectively. In this scenario, higher sampling rates reduce the standard deviation and thereby improve performance. In general, a lower standard deviation is desirable as it results in a more stable operation.

In comparison, the conventional coarse and fine TDA operation would yield σ values of 0.0594, 0.1481, and 0.2195 corresponding to sampling rates S, S/2, and S/3, respectively. The additional fine TDA would yield a minimal improvement at the nominal sampling rate S but would actually degrade alignment performance at the lower sampling rates (i.e., the sigma values at S/2 and S/3 are comparatively greater for the coarse and fine TDA relative to the coarse TDA).

The high complexity FDA only operation (e.g., where each FFT and iFFT takes 32K cycles) would yield σ values of 0.1594, 0.1385, and 0.2174 corresponding to sampling rates S, S/2, and S/3, respectively. At sampling rate S, the performance of the 32K FDA is substantially worse than that of the pure TDA techniques (i.e., a sigma of 0.1594 is greater than 0.0619 by more than a factor of two). At lower sampling rates of S/2 and S/3, the performance of the 32K FDA is substantially similar to that of the TDA only operations.

In comparison, the reduced complexity FDA only operation (e.g., where each FFT and iFFT would take 8K cycles instead of 32K cycles) would yield σ values of 0.4051, 0.2656, and 0.4360 corresponding to sampling rates S, S/2, and S/3, respectively. Clearly, the reduced latency offered by the 8K FDA relative to the 32K FDA comes at the cost of degraded stability at all sampling frequencies. In the example of FIG. 11, a sigma of 0.4051 for the 8K FDA at a sampling rate of 61.44 MHz is greater than the sigma of 0.1594 for the 32K FDA at the same sampling rate by more than a factor of two. Similarly, a sigma of 0.2656 for the 8K FDA at a sampling rate of 30.72 MHz is greater than the sigma of 0.1385 for the 32K FDA at the same sampling rate by almost a factor of two.

In contrast, predistortion circuitry that performs coarse TDA in conjunction with a reduced complexity FDA (e.g., an 8K FDA) can yield reasonably good stability at all sampling rates. As illustrated in FIG. 11, the combined TDA and FDA operation would yield σ values of 0.0786, 0.0697, and 0.0666 corresponding to sampling rates S, S/2, and S/3, respectively. The joint TDA and FDA architecture yields substantially similar performance as the TDA only operation at the nominal sampling rate S and exhibits significantly better stability performance at the lower sampling rates (e.g., by more than a factor of two for S/2 and S/3). In other words, digital predistortion circuitry 108 that performs both TDA and FDA not only offers a good tradeoff between memory requirement and latency but also provides improved performance at most sampling rates.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit, comprising:
   a time domain alignment circuit that is configured to perform time domain alignment operations; and
   a frequency domain alignment circuit that is coupled to the time domain alignment circuit that is configured to perform frequency domain alignment operations and that includes a matrix inversion circuit that performs matrix inversion operations.

2. The integrated circuit defined in claim 1, wherein the time domain alignment circuit and the frequency domain alignment circuit are coupled in series.

3. The integrated circuit defined in claim 1, further comprising:
   an amplifier having an input that receives first signals and an output on which second signals are generated, wherein the time domain alignment circuit has inputs that receive the first and second signals.

4. The integrated circuit defined in claim 3, wherein the frequency domain alignment circuit produces aligned versions of the first and second signals, the integrated circuit further comprising:
   an adaption circuit that receives the aligned versions of the first and second signals and produces corresponding coefficients based on a predetermined model associated with the amplifier.

5. The integrated circuit defined in claim 4, further comprising:
   a filtering circuit having an input that receives transmit signals and an output on which a distorted version of the transmit signals is generated, wherein the distorted version of the transmit signals is fed to the amplifier, and wherein the filter circuit distorts the transmit signals by filtering the transmit signals based on the coefficients produced by the adaption circuit.

6. The integrated circuit defined in claim 5, wherein the filtering circuit comprises a finite impulse response filter.

7. The integrated circuit defined in claim 1, wherein the time domain alignment circuit includes circuitry selected from the group consisting of: a time domain cross-correlation circuit, a peak detection circuit, and a delay circuit.

8. The integrated circuit defined in claim 1, wherein the frequency domain alignment circuit further includes circuitry selected from the group consisting of: a fast Fourier transform circuit and a matrix multiplier.

9. The integrated circuit defined in claim 4, wherein the adaption circuit shares the matrix inverting circuit in the frequency domain alignment circuit.

10. A method of operating an integrated circuit that includes a time domain alignment circuit and a frequency domain alignment circuit, comprising:
  with the time domain alignment circuit, receiving first and second signals and performing coarse alignment on the first and second signals to produce time domain aligned signals;
  with the frequency domain alignment circuit, receiving the time domain aligned signals from the time domain alignment circuit and performing fine alignment on the time domain aligned signals to produce frequency domain aligned signals by performing cross-correlation in frequency domain on the time domain aligned signals; and
  with matrix inversion circuitry shared by the frequency domain alignment circuit and an adaption circuit on the integrated circuit, performing matrix inversion operations.

11. The method defined in claim 10, further comprising:
  with a radio-frequency power amplifier on the integrated circuit, amplifying the first signal to produce the second signal.

12. The method defined in claim 10, wherein performing the coarse alignment on the first and second signals comprises performing cross-correlation in time domain.

13. The method defined in claim 10, wherein the time domain aligned signals have frequency domain representations and wherein performing cross-correlation in frequency domain comprises:
  computing a plurality of products of the frequency domain representations of the time domain aligned signals; and
  detecting a maximal value from the plurality of products.

14. The method defined in claim 10, wherein performing the fine alignment on the time domain aligned signals comprises performing fast Fourier transform (FFT) operations on the time domain aligned signals.

15. The method defined in claim 10, further comprising:
  with the adaption circuit on the integrated circuit, receiving the frequency domain aligned signals from the frequency domain alignment circuit and generating corresponding filter coefficients by performing matrix inverting operations.

16. The method defined in claim 15, further comprising:
  with a filter on the integrated circuit, receiving a transmit signal and predistorting the transmit signal to produce the first signal by filtering the transmit signal using the filter coefficients generated by the adaption circuit.

\* \* \* \* \*